US012806707B2

(12) United States Patent
Heo et al.

(10) Patent No.: US 12,806,707 B2
(45) Date of Patent: Nov. 24, 2026

(54) WIRE CLAMP AND WIRE BONDING APPARATUS INCLUDING THE SAME

(71) Applicant: Samsung Electronics Co., Ltd., Suwon-si (KR)

(72) Inventors: Jaehyeok Heo, Cheonan-si (KR); Hyosung Koo, Asan-si (KR); Munsoo Park, Cheonan-si (KR); Yong Je Lee, Sejong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 996 days.

(21) Appl. No.: 17/959,786

(22) Filed: Oct. 4, 2022

(65) Prior Publication Data

US 2023/0230952 A1 Jul. 20, 2023

(30) Foreign Application Priority Data

Jan. 17, 2022 (KR) ........................ 10-2022-0006358

(51) Int. Cl.
*B23K 9/28* (2006.01)
*H10W 72/00* (2026.01)

(52) U.S. Cl.
CPC ......... *B23K 9/28* (2013.01); *H10W 72/07141* (2026.01); *H10W 72/07168* (2026.01)

(58) Field of Classification Search
CPC ..... H01L 24/78; H01L 21/60; H01L 2224/48; H01L 2224/78611; H01L 222/78631; B23K 9/28; B23K 9/282; B23K 9/287; B23K 20/007; B23K 2101/42; H10W 72/07141; H10W 72/07168
See application file for complete search history.

(56) References Cited

U.S. PATENT DOCUMENTS 4,653,681 A 3/1987 Dreibelbis et al.
5,931,452 A 8/1999 Nakatomi et al.
6,899,262 B2 5/2005 Gaunekar et al.
7,549,569 B2 6/2009 Kwan et al.
2004/0232203 A1* 11/2004 Gaunekar ............ B23K 20/004 228/180.5

(Continued)

FOREIGN PATENT DOCUMENTS

KR 10-0261500 B1 7/2000
KR 10-2002-0053931 A 7/2002
KR 10-0585600 B1 6/2006

OTHER PUBLICATIONS

Machine Translation of Ahn (KR 100388957) performed on Feb. 10, 2026 (Year: 2002).*

*Primary Examiner* — Brian W Jennison
(74) *Attorney, Agent, or Firm* — Fish & Richardson P.C.

(57) ABSTRACT

Disclosed are wire clamps and wire bonding apparatuses including the same. The wire clamp comprises a clamping lever, a driving lever parallel to the clamping lever and having an upper support, a shaft that penetrates a center of the driving lever to connect to the clamping lever, a spring in the driving lever and on an outer circumferential surface of the shaft, and an upper pivot that protrudes from an inner wall of the upper support to separate the upper support from the clamping lever. The driving lever has a load point and an effort point on opposite sides of the shaft. The effort point is connected in a direction of a straight line to the shaft and the effort point.

15 Claims, 5 Drawing Sheets

(56) References Cited

U.S. PATENT DOCUMENTS

| | | | | |
|---|---|---|---|---|
| 2008/0000946 | A1* | 1/2008 | Kwan | B23K 20/004 228/180.5 |
| 2008/0302857 | A1* | 12/2008 | Felber | B23K 20/004 228/47.1 |
| 2015/0040360 | A1* | 2/2015 | Manganaro | A43C 7/04 24/712.6 |
| 2019/0237428 | A1 | 8/2019 | Fujino et al. | |

* cited by examiner

WIRE CLAMP AND WIRE BONDING APPARATUS INCLUDING THE SAME

CROSS-REFERENCE TO RELATED APPLICATION

This U.S. nonprovisional application claims priority under 35 U.S.C § 119 to Korean Patent Application No. 10-2022-0006358 filed on Jan. 17, 2022 in the Korean Intellectual Property Office, the disclosure of which is hereby incorporated by reference in its entirety.

BACKGROUND

The present inventive concepts relate to wire bonding apparatuses, and more particularly, to wire clamps and wire bonding apparatuses including the same.

In general, a wire bonding process may indicate a process in which a gold or aluminum wire is used to electrically connect a semiconductor chip to an external device such as a lead frame. A capillary may be mainly used to perform the wire bonding process. A wire ball is formed on an electrode pad of a semiconductor chip, and one end of the wire is bonded to the lead frame. The wire bonding may be used not only to connect the semiconductor chip to the lead frame but also to connect the semiconductor chip to a wiring line of a circuit board, and may be one of the most widely used chip bonding methods.

SUMMARY

Some example embodiments of the present inventive concepts provide a wire clamp capable of reducing partial abrasion of a pivot due to displacement of a driving lever and a wire bonding apparatus including the same.

According to some example embodiments of the present inventive concepts, a wire clamp may comprise: a clamping lever; a driving lever extending parallel to the clamping lever and having an upper support; a shaft that penetrates a center of the driving lever to connect to the clamping lever; a spring in the driving lever and on an outer circumferential surface of the shaft, the spring configured to press the driving lever against the clamping lever; and an upper pivot that protrudes from an inner wall of the upper support and is configured to isolate the upper support from direct contact with the clamping lever. The driving lever may have a load point and an effort point at opposite ends of the driving lever and on opposite sides of the shaft. The effort point may be connected in a direction of a straight line to the shaft and the effort point, the straight line intersecting the effort point, the load point, and the center of the driving lever.

According to some example embodiments of the present inventive concepts, a wire bonding apparatus may comprise: a bonder body; a wire spool on the bonder body, the wire spool configured to release a wire; a capillary below the bonder body, the capillary configured to press the wire against a substrate; and a wire clamp between the capillary and the wire spool, the wire clamp configured to hold the wire. The wire clamp may include: a clamping lever; a driving lever extending parallel to the clamping lever and having an upper support; a shaft that penetrates a center of the driving lever to connect to the clamping lever; a spring in the driving lever and on an outer circumferential surface of the shaft, the spring configured to press the driving lever against the clamping lever; and an upper pivot that protrudes from an inner wall of the upper support and configured to isolate the upper support from direct contact with the clamping lever. The driving lever may have a load point and an effort point at opposite ends of the driving lever and on opposite sides of the shaft. The effort point may be connected in a direction of a straight line to the shaft and the effort point, the straight line intersecting the effort point, the load point, and the center of the driving lever.

According to some example embodiments of the present inventive concepts, a wire clamp may comprise: a clamping lever; a driving lever parallel to the clamping lever and having an upper support and a lower support below the upper support; a shaft that penetrates a center of the driving lever to connect to the clamping lever; a spring in the driving lever and on an outer circumferential surface of the shaft, the spring pressing the driving lever against the clamping lever; an upper pivot that protrudes from an inner wall of the upper support, the upper pivot configured to isolate the upper support from direct contact with the clamping lever; and a lower pivot that protrudes from an inner wall of the lower support, the lower pivot configured to isolate the lower support from direct contact with the clamping lever. The driving lever may be between the upper pivot and the lower pivot and has a shape of a rhombus.

DETAILED DESCRIPTION

Figure 1:
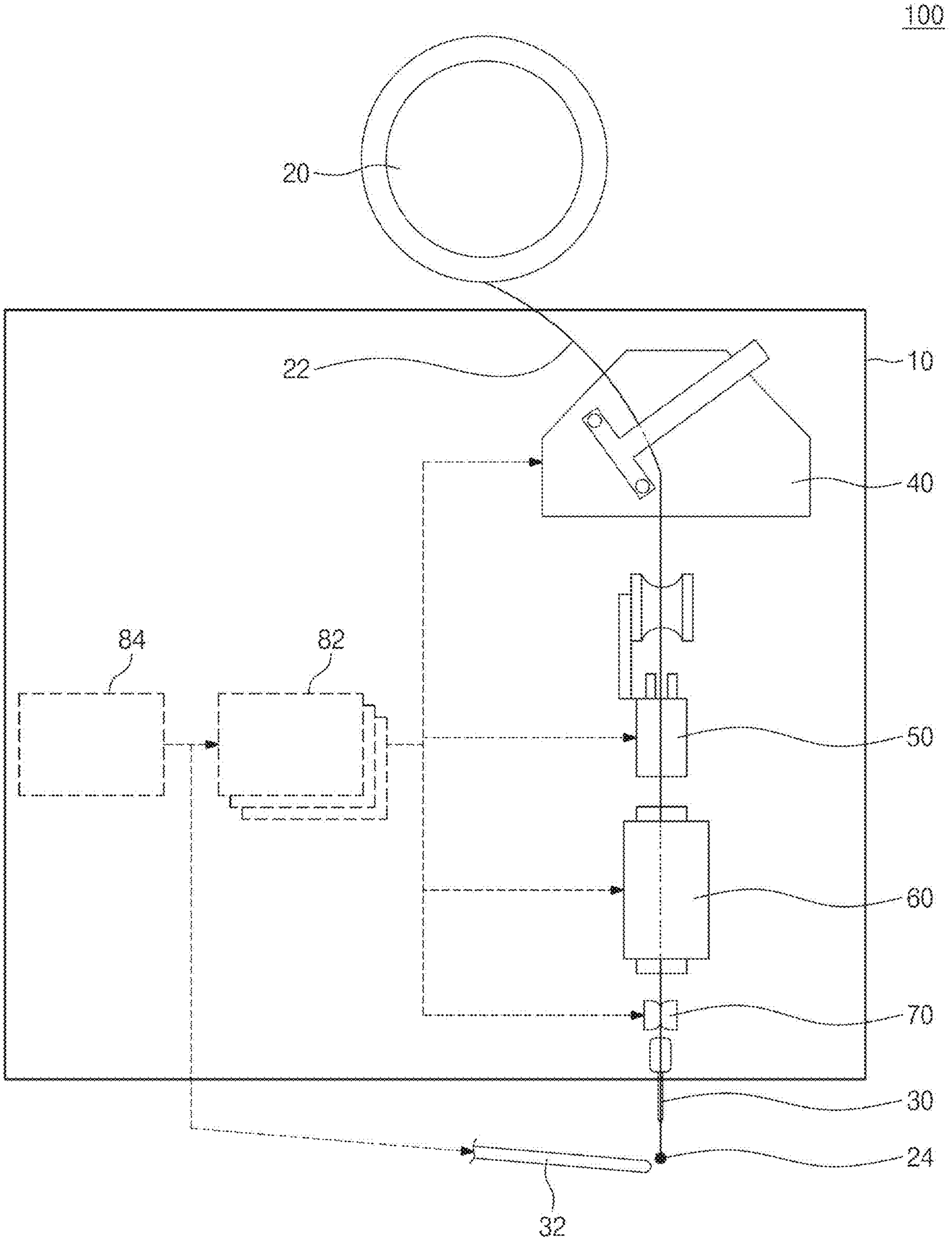
FIG. 1 shows an example of a wire bonding apparatus according to some example embodiments of the present inventive concepts.
Figure 2:
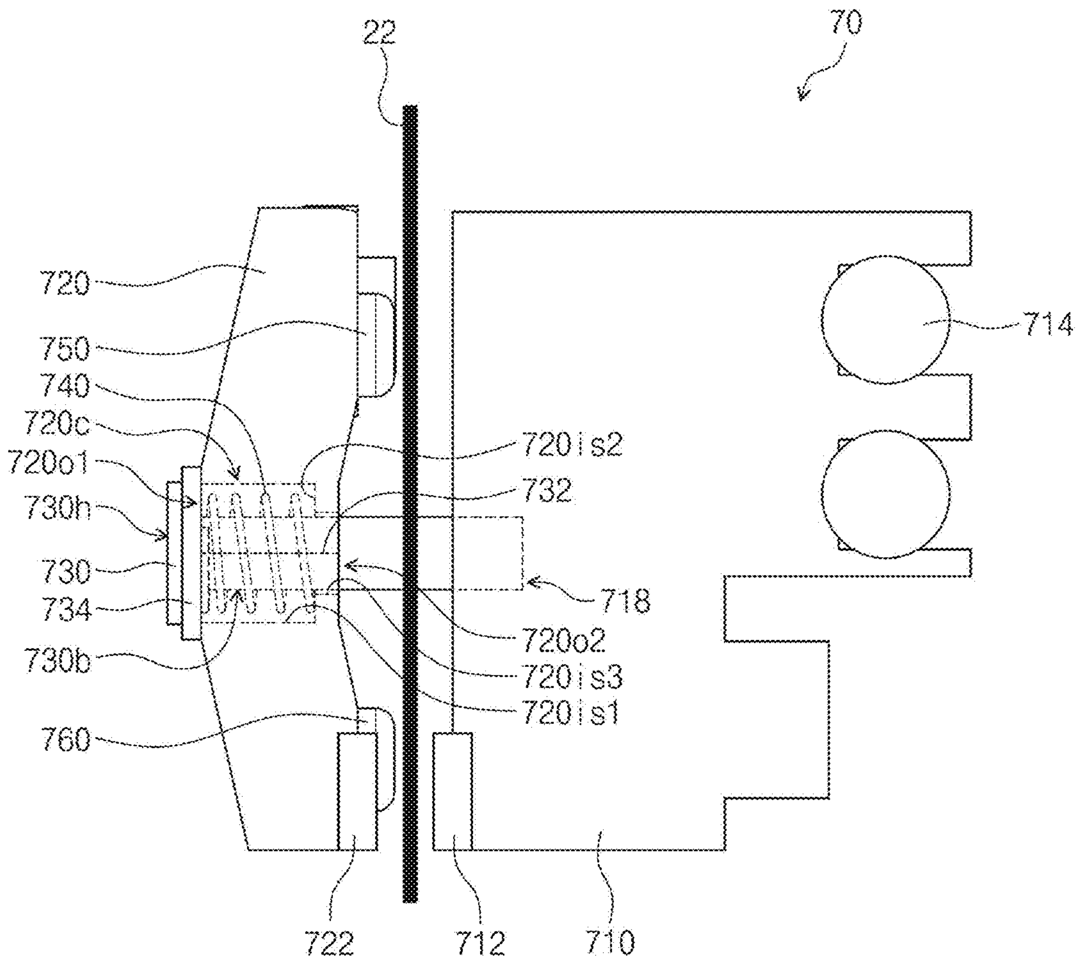
FIGS. 2, 3, 4, and 5 show a wire clamp of FIG. 1 according to some example embodiments of the present inventive concepts.
Figure 3:
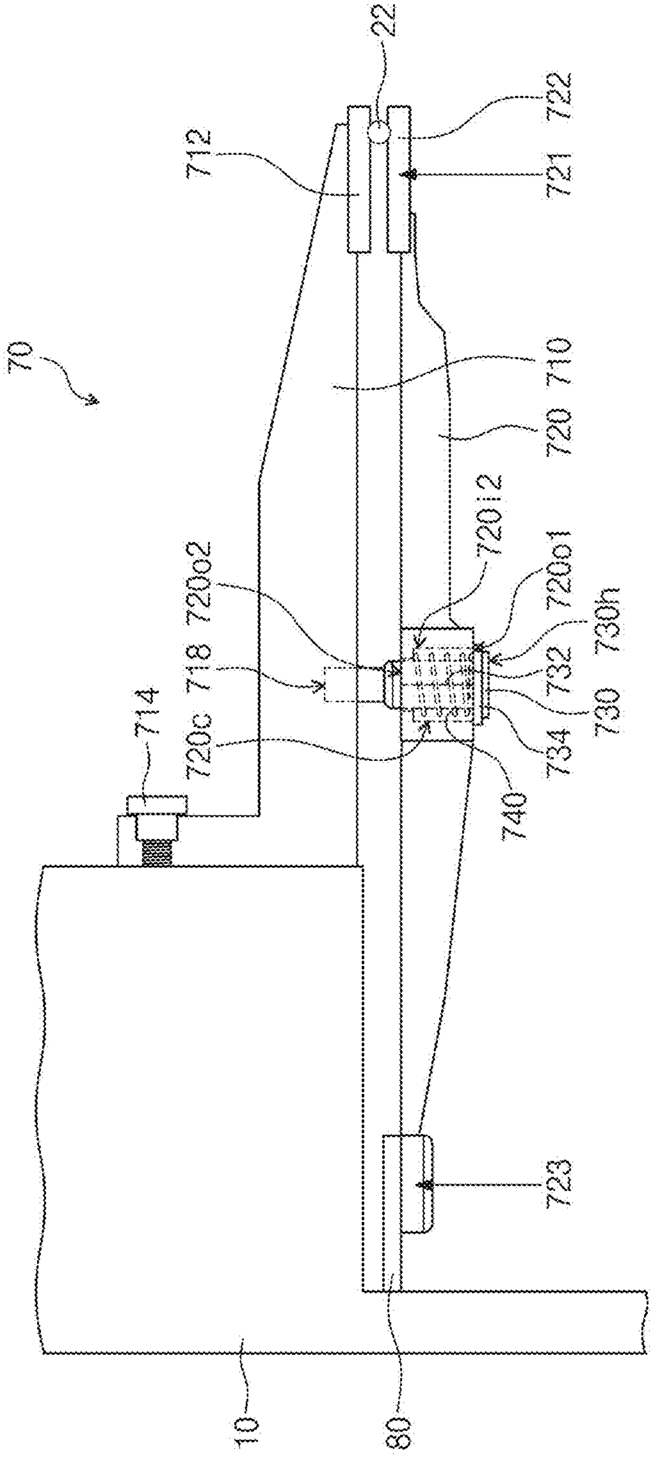

Hereinafter, some example embodiments will be described in detail with reference to the accompanying drawings.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

FIG. 1 shows an example of a wire bonding apparatus 100 according to some example embodiments of the present inventive concepts.

Referring to FIG. 1, the wire bonding apparatus 100 according to some example embodiments of the present inventive concepts may include a bonder body 10, a wire spool 20, a capillary 30, a first wire tensioner 40, a wire guide 50, a second wire tensioner 60, and a wire clamp 70.

The bonder body 10 may support the wire spool 20, the capillary 30, the first wire tensioner 40, the wire guide 50, the second wire tensioner 60, and the wire clamp 70. Although not shown, the bonder body 10 may move or drive the capillary 30, the first wire tensioner 40, the wire guide 50, the second wire tensioner 60, and the wire clamp 70, but the present inventive concepts are not limited thereto. For example, as shown in FIG. 1, the wire bonding apparatus 100 may include, as part of the bonder body 10 or separate from the bonder body 10, one or more drivers 82 that may be configured to drive (e.g., actuate, move, etc.) one or more of the capillary 30, the first wire tensioner 40, the wire guide 50, the second wire tensioner 60, and/or the wire clamp 70. The one or more drivers 82 may each be a motor, an actuator, a servoactuator, a servomotor (e.g., rotary servoactuator and/or linear servoactuator), or the like. The wire bonding apparatus 100 may include, as part of the bonder body 10 or separate from the bonder body 10, a control device 84 configured to operate the one or more drivers 82 to control (e.g., to drive) one or more of the capillary 30, the first wire tensioner 40, the wire guide 50, the second wire tensioner 60, and/or the wire clamp 70 and thus to operate the wire bonding apparatus 100.

As described herein, any apparatuses, devices, systems, blocks, modules, units, controllers, circuits, apparatus, and/or portions thereof according to any of some example embodiments (including, without limitation, any of the example embodiments of the wire bonding apparatus 100, the control device 84, the one or more drivers 82, the bonder body 10, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any apparatuses, devices, systems, blocks, modules, units, controllers, circuits, apparatuses, and/or portions thereof according to any of some example embodiments, and/or any portions thereof, including for example some or all operations of any of the methods and/or processes shown in any of the drawings.

The wire spool 20 may be provided on the bonder body 10. The wire spool P may release a wire 22. The wire 22 may include gold (Au) or aluminum (Al). For example, the wire spool 20 may include a spindle or a bobbin.

The capillary 30 may be connected to a lower portion of the bonder body 10. The capillary 30 may move (e.g., based on being moved by a driver 82) in a horizontal direction or a vertical direction, while being loaded on a bonder head (not shown) of the bonder body 10. The wire 22 may be provided into the capillary 30. When the bonder head descends, the capillary 30 may press the wire 22 against a semiconductor chip (not shown). A torch electrode 32 may be provided which is adjacent to the capillary 30. Before that, the torch electrode 32 may heat the wire 22 to form a wire ball 24. The wire ball 24 may be provided on a pad region of the semiconductor chip, but the present inventive concepts are not limited thereto. The torch electrode 32 may be controlled by one or more control devices 84 of the wire bonding apparatus 100. The torch electrode 32 may cut the wire 22, but the present inventive concepts are not limited thereto.

The first wire tensioner 40 may be provided on the bonder body 10 adjacent to the wire spool 20. The first wire tensioner 40 may tension the wire 22 from the wire spool 20. For example, the first wire tensioner 40 may include an air balloon holder or a pair of tongs, but the present inventive concepts are not limited thereto.

The wire guide 50 may be provided between the first wire tensioner 40 and the second wire tensioner 60. The wire guide 50 may withdraw the wire 22 from the first wire tensioner 40 to form a wire loop (not shown) between the first wire tensioner 40 and the second wire tensioner 60. For example, the wire guide 50 may include at least one pulley, but the present inventive concepts are not limited thereto.

The second wire tensioner 60 may be provided between the wire guide 50 and the wire clamp 70. The second wire tensioner 60 may tension the wire 22 that is held by the wire clamp 70. In addition, the second wire tensioner 60 may tension the wire 22 when the wire loop is formed. The second wire tensioner 60 may include an air balloon holder or a pair of tongs, but the present inventive concepts are not limited thereto.

The wire clamp 70 may be provided between the second wire tensioner 60 and the capillary 30. When the wire ball 24 is formed below the capillary 30, the wire clamp 70 may hold or clamp the wire 22.

FIGS. 2, 3, 4, and 5 show the wire clamp 70 of FIG. 1 according to some example embodiments of the present inventive concepts.

Referring to FIGS. 2 to 5, the wire clamp 70 may include a clamping lever 710, a driving lever 720, a shaft 730, a spring 740, an upper pivot 750, and a lower pivot 760.

The clamping lever 710 may be fastened through a plurality of screws 714 to the bonder head of the bonder body 10 depicted in FIG. 1. Each of the plurality of screws 714 may include a stepped bolt. The clamping lever 710 may have an L shape when viewed in plan. The clamping lever 710 may have a first pad 712. The first pad 712 may be connected to a distal end of the clamping lever 710. The first pad 712 may include a sapphire (e.g., may include a sapphire structure comprising sapphire material), but the present inventive concepts are not limited thereto.

The driving lever 720 may be disposed spaced apart from (e.g., isolated from direct contact with) the clamping lever 710. When viewed in plan, the driving lever 720 may be parallel to the clamping lever 710. For example, the driving lever 720 may have a load point 721 and an effort point 723 at opposite ends of the driving lever 720 (e.g., at opposite sides of the driving lever 72) and on opposite sides of the shaft 730.

The load point 721 may be provided adjacent to the first pad 712. A second pad 722 may be provided on the load point 721. The first pad 712 and the second pad 722 may be parallel to each other. When the load point 721 approaches the first pad 712, the first pad 712 and the second pad 722 may clamp the wire 22.

Figure 4:
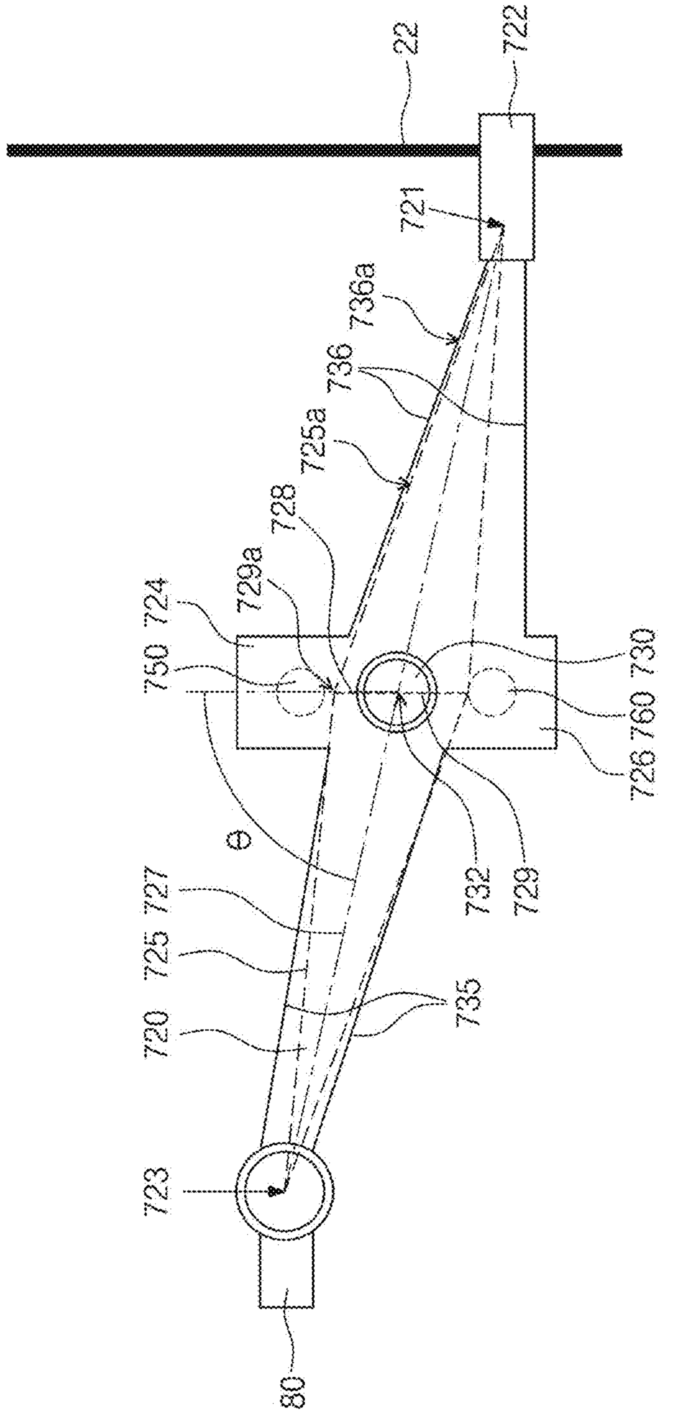
Figure 5:
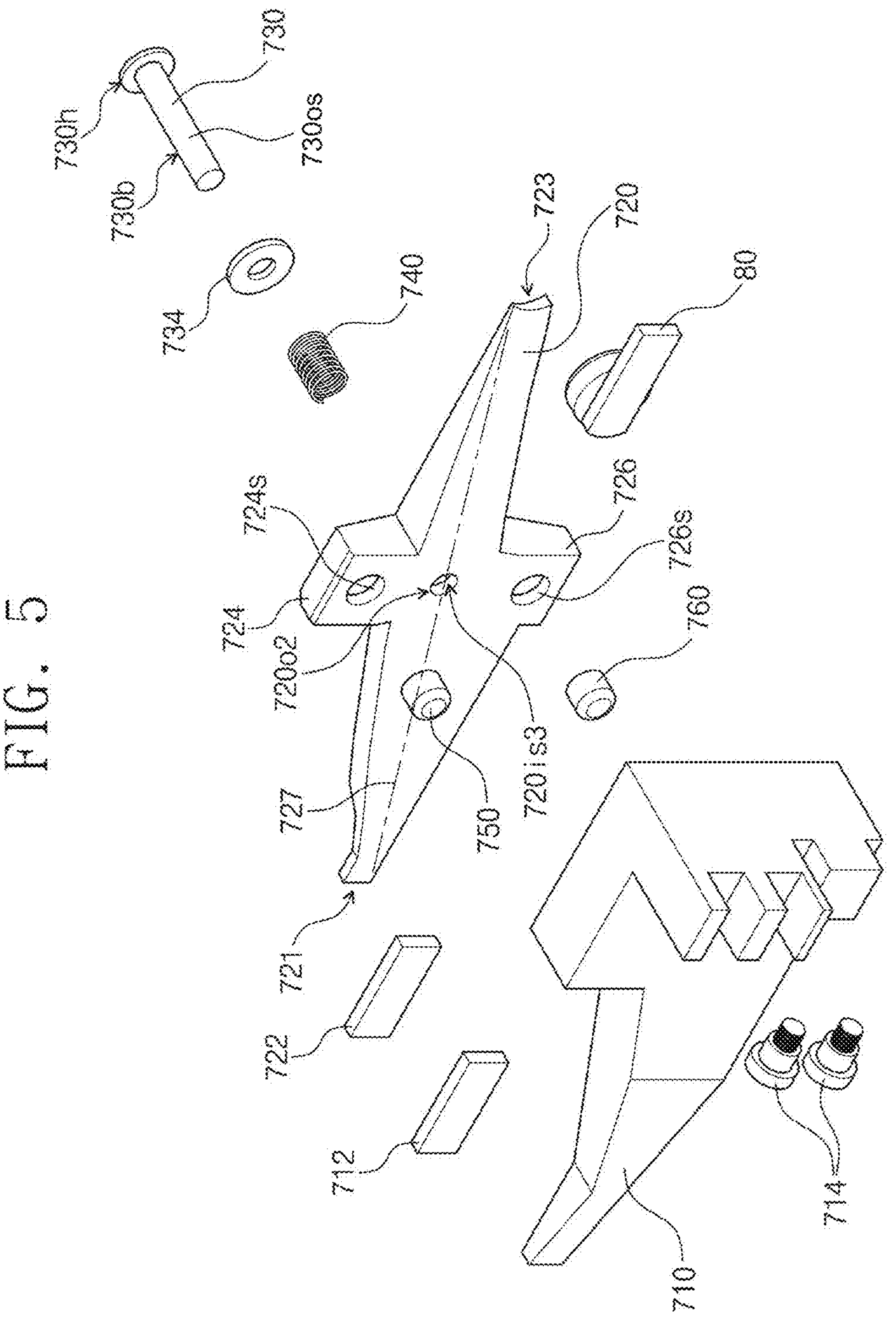

Referring to FIG. 4, the effort point 723 may be connected in a direction of a straight line 727 to the shaft 730 and the load point 721. The effort point 723 may be connected to a bimorph 80. The bimorph 80 may be connected to the bonder body 10. The bimorph 80 may be a driver (e.g., one of the drivers 82) which may cause the effort point 723 to move up and down. When the bimorph 80 and the effort point 723 move upwardly, the first pad 712 and the second pad 722 may become close to each other to clamp the wire 22. When the bimorph 80 and the effort point 723 move downwardly, the second pad 722 may become away from the first pad 712 such that the wire 22 may be released. Accordingly, the wire clamp 70 may be understood to be configured to cause the driving lever 720 to move in relation to the clamping lever 710 to cause the second pad 722 to move closer to the first pad 712 and/or to move away from the first pad 712 (e.g., to move in relation to the first pad 712).

According to some example embodiments, the driving lever 720 may have a lateral surface shaped like a rhombus 725 (e.g., having a shape of a rhombus 725) such that surfaces 735 extending between the effort point 723 and the center 732 of the driving lever 720 (e.g., between the minor axis 729 of the rhombus that intersects the center 732 and a vertex of the rhombus 725 defined by the effort point 723, where the minor axis 729 may further be aligned with the upper pivot 750 and/or the lower pivot 760 but may be configured to define minor vertices of the rhombus 725 to be between and to not intersect the upper and lower pivots 760 and 750) are inclined to narrow from the minor axis 729 at the center 732 towards the effort point 723, and such that surfaces 736 extending between the load point 721 and the center 732 of the driving lever 720 (e.g., between the minor axis 729 of the rhombus that intersects the center 732 and a vertex of the rhombus 725 defined by the load point 721) are inclined to narrow from the minor axis 729 at the center 732 towards the load point 721. As further shown, an upper surface **736*a* extending between the upper support 724 and the load point 721 may be at least partially parallel with a proximate side 725*a* of the rhombus 725 extending between a vertex 729*a* at least partially defining the minor axis 729 and the load point 721. In some example embodiments, the upper surface 736*a* may be coplanar with the proximate side 725*a* of the rhombus 725 at least partially defined between load point 721 and effort point 723. The driving lever 720 may extend in a major axis of the rhombus 725. The major axis of the rhombus 725 may correspond to the straight line 727 between the load point 721 and the effort point 723, which may further intersect the center 732 of the driving lever 720. The center 732 may be a fulcrum point of the driving lever 720 and/or may be a geometric center, a center of mass, or the like of the driving lever 720. The driving lever 720 may have an upper support 724 (e.g., an upper support member, an upper support beam, an upper support structure, etc.) and the lower support 726 (e.g., a lower support member, a lower support beam, a lower support structure, etc.). The upper support 724 may be provided on a center of the driving lever 720 (e.g., at a location that is about equidistant between the effort point 723 and the load point 721). The minor axis 729 of the rhombus 725 may be defined to intersect the upper support 724 (e.g., upper pivot 750), the center 732, and the lower support 726 (e.g., lower pivot 760). The upper support 724 may have an included angle θ of about 80° to about 85° from the driving lever 720 or the straight line 727, which may be a longitudinal axis extending between the effort point 723 and the load point 721, and where the angle θ is an angle around the center 732 from the straight line 727 (or longitudinal axis) intersecting the effort point 723, the load point 721, and the center 732) and straight line 728 which may be a longitudinal axis of the upper support 724 and which may be an axis intersecting the upper pivot 750, and the center 732 and may further extend to intersect the lower pivot 760 as shown in at least FIG. 4. For example, the driving lever 720 may have an included angle θ of about 80° to about 85° relative to the upper support 724. The included angle θ may be, for example, about 82°. The lower support 726 may be provided below the center of the driving lever 720**.

Referring back to FIGS. 2 to 5, the shaft 730 may penetrate the center 732 of the driving lever 720 to connect to the clamping lever 710 (e.g., to screw into a threaded receiving hole 718 in the clamping lever 710). The shaft 730 may be provided at a fulcrum point of the driving lever 720 (e.g., at the center 732).

The spring 740 may be provided in the driving lever 720. The spring 740 may be wound on an outer circumferential surface **730*os* of a shaft body 730*b* of the shaft 730. The spring 740 may press the driving lever 720 against the clamping lever 710. As shown, the driving lever 720 may include inner surfaces 720*is*1, 720*is*2, 720*is*3 at least partially defining a truncated cylindrical conduit 720*c* extending through an interior of the driving lever 720 between opposite openings 720*o*1, 720*o*2, e.g., coaxially with center 732, where the axially-facing inner surface 720*is*2 define an inner ledge extending between the larger inner diameter of the conduit 720*c* defined by inner surface 720*is*1 and the smaller inner diameter of the conduit 720*c* at the second opening 720*o*2 that is defined by inner surface 720*is*3. The spring 740 may be wound around the outer circumferential surface 730*os* between the first opening 720*o*1 and the second inner surface 720*is*2 and between the outer circumferential surface 730*os* and the inner surface 720*is*1 within the conduit 720*c*, thereby being in or within the driving lever 720. The spring 740 may contact, at one end, a part of the shaft 730 (e.g., the head 730*h* which may be wider than the first opening 720*o*1 proximate to the head 730*h*) or a washer 734 that is between a portion of the shaft 730 (e.g., head 730*h*) and the first opening 720*o*1 and is wider than the first opening 720*o*1, and the spring 740 may contact, at an opposite end, a part of the inner surface 720*is*2, so that the spring 740 may exert a spring force between the shaft 730 (e.g., the head 730*h* directly or via washer 734) and the driving lever 720 (e.g., the inner surface 720*is*2) to press the driving lever 720 away from a portion of the shaft 730 that is distal from the clamping lever 710 (e.g., away from shaft head 730*h* and towards the clamping lever 710. The spring 740** may have an elastic modulus of about 628 gf/mm$^2$.

The upper pivot 750 may be provided on an inner wall **724*s* of the upper support 724. The upper pivot 750 may protrude from the inner wall 724*s* of the upper support 724. The upper pivot 750 may define an interval between the upper support 724 and the clamping lever 710. For example, the upper pivot 750 may isolate the upper support 724 from direct contact with the clamping lever 710 by the defined interval therebetween. In addition, the upper pivot 750 may prevent the upper support 724 and the driving lever 720 from being inclined with respect to the clamping lever 710. For example, the upper pivot 750** may include a sapphire.

The lower pivot 760 may be provided on an inner wall **726*s* of the lower support 726. The lower pivot 760 may protrude from the inner wall 726*s* of the lower support 726. The lower pivot 760 may define an interval between the lower support 726 and the clamping lever 710. For example, the lower pivot 760 may isolate the lower support 726 from direct contact with the clamping lever 710 by the defined interval therebetween. In addition, the lower pivot 760 may prevent the lower support 726 and the driving lever 720 from being inclined with respect to the clamping lever 710. For example, the lower pivot 760** may include a sapphire.

An effort point of a typical driving lever may be connected in a horizontal direction to the upper support 724. For the typical driving lever, when the effort point moves downwardly, a load may be delivered (e.g., transmitted) to the upper pivot 750 (e.g., from the effort point 723 based on the load being applied to the effort point 723 by the bimorph 80) and thus the upper pivot 750 may suffer from partial abrasion due to transmission of the load from the effort point 723 to the upper pivot 750.

In contrast, according to some example embodiments of the present inventive concepts, based on the driving lever 720 having the rhombus shape, the driving lever 720 may be configured such that the effort point 723 is connected in a direction of the straight line 727 to the shaft 730 and the load point 721 where such connection in the direction of the straight line 727 does not intersect the upper pivot 750, so that the wire clamp 70 is configured to cause the effort point 723 to move so that a load applied to the effort point 723 by the bimorph 80, may be transmitted from the effort point 723 towards the load point 721 through the driving lever 720 along the direction of the straight line 727 through the center 732 so as to bypass the upper pivot 750 based on the rhombus 725 shape of the driving lever 720 configuring the driving lever 720 to partially or fully isolate the upper pivot 750 from receiving a load transmitted from the effort point 723 towards the load point 721 along the straight line 727, so that the load is not delivered to the upper pivot 750, and such that partial abrasion of the upper pivot 750 due to such load transmission is reduced, minimized, or prevented from occurring. As a result of such partial abrasion being reduced, minimized, or prevented, the wire clamp 70 may be configured to operate with improved performance and reliability, with reduced replacement frequency due to the partial abrasion thereby reducing maintenance and/or replacement costs associated with the wire clamp 70 and/or wire bonding apparatus 100 including same. Such reduced, minimized, or prevented partial abrasion of the upper pivot 750 may further result in reduced, minimized, or prevented wire short failure due to damage to the wire 22 during a wire bonding process performed using the wire clamp 70, thereby configuring the wire clamp 70 to manufacture devices (e.g., based on performing wire bonding) having improved reliability due to reduced, minimized, or prevented wire short failures due to damage to the wires 22 that might otherwise result from performing the wire bonding process using a wire clamp 70 having an upper pivot 750 with a partial abrasion thereof.

Accordingly, the wire clamp 70 of the present inventive concepts may be configured to reduce or prevent damage to the upper pivot 750 caused by displacement of the driving lever 720, thereby improving reliability and performance of the wire clamp 70 and further reducing the frequency of replacement of the wire clamp 70 in a wire bonding apparatus 100, thereby reducing replacement costs and/or maintenance costs associated with operating the wire clamp 70 and/or the wire bonding apparatus 100.

As discussed above, a wire clamp according to some example embodiments of the present inventive concepts may use a driving lever configured to connect an effort point in a straight direction to a load point (e.g., where the upper pivot is at least partially isolated from the transmission path of load transmission from the effort point to the load point), and thus it may be possible to reduce partial abrasion of pivots due to displacement of the driving lever (e.g., partial abrasion that might occur due to transmission of load from the effort point to one or more of the pivots as a result of the displacement).

The above descriptions are specific examples for practicing the present inventive concepts. The present inventive concepts will include not only the example embodiments described above but also example embodiments that can be easily or simply changed in design. In addition, the present inventive concepts will also include techniques that can be easily modified and implemented using the example embodiments described above.

What is claimed is:

1. A wire clamp, comprising:

a clamping lever;

a driving lever extending parallel to the clamping lever, the driving lever having an upper support;

a shaft that penetrates a center of the driving lever to connect to the clamping lever;

a spring in the driving lever and on an outer circumferential surface of the shaft, the spring configured to press the driving lever against the clamping lever; and an upper pivot that protrudes from an inner wall of the upper support, the upper pivot configured to isolate the upper support from direct contact with the clamping lever, wherein the driving lever has a load point and an effort point at opposite ends of the driving lever and on opposite sides of the shaft, the effort point being connected in a direction of a straight line to the shaft and the effort point, the straight line intersecting the effort point, the load point, and the center of the driving lever, and wherein upper and lower edges of a lateral surface of the driving lever extend between the effort point and the center of the driving lever and are inclined toward one another such that the lateral surface narrows towards the effort point.

2. The wire clamp of claim 1, wherein the lateral surface has a shape of a rhombus.

3. The wire clamp of claim 2, wherein the straight line corresponds to a major axis of the rhombus, such that the effort point and the load point define opposite major vertices of the rhombus and the center of the driving lever defines a center of the rhombus.

4. The wire clamp of claim 1, wherein the driving lever has an included angle of about 80° to about 85° with respect to the upper support.

5. The wire clamp of claim 4, wherein the included angle is about 82°.

6. The wire clamp of claim 1, wherein the driving lever has a lower support below the shaft such that the upper support and the lower support are on opposite sides of the shaft.

7. The wire clamp of claim 6, further comprising a lower pivot that protrudes from an inner wall of the lower support, the lower pivot configured to isolate the lower support from direct contact with the clamping lever.

8. The wire clamp of claim 7, wherein the driving lever is between the upper pivot and the lower pivot.

9. The wire clamp of claim 1, wherein the clamping lever has a first pad on a distal end of the clamping lever, and the driving lever has a second pad on the load point, wherein the wire clamp is configured to cause the driving lever to move in relation to the clamping lever to cause the second pad to move closer to the first pad.

10. The wire clamp of claim 1, wherein the spring has an elastic modulus of about 628 $gf/mm^2$.

11. A wire clamp, comprising:

a clamping lever;

a driving lever extending parallel to the clamping lever and having an upper support and a lower support below the upper support;

a shaft that penetrates a center of the driving lever to connect to the clamping lever;

a spring in the driving lever and on an outer circumferential surface of the shaft, the spring configured to press the driving lever against the clamping lever;

an upper pivot that protrudes from an inner wall of the upper support, the upper pivot configured to isolate the upper support from direct contact with the clamping lever; and a lower pivot that protrudes from an inner wall of the lower support, the lower pivot configured to isolate the lower support from direct contact with the clamping lever, wherein the driving lever has a lateral surface forming a shape of a rhombus, wherein the upper pivot is entirely above the rhombus formed by the lateral surface.

12. The wire clamp of claim 11, wherein the driving lever has an effort point and a load point at opposite ends of the driving lever and at opposite sides of the shaft, wherein the effort point and the load point are connected to a major axis of the rhombus the major axis of the rhombus intersecting the effort point, the load point, and the center of the driving lever.

13. The wire clamp of claim 11, wherein the driving lever has an included angle of about 80° to about 85° with respect to the upper support.

14. The wire clamp of claim 13, wherein the included angle is about 82°.

15. The wire clamp of claim 11, wherein the spring has an elastic modulus of about 628 $gf/mm^2$.

* * * * *